(12) United States Patent
Hyde

(10) Patent No.: US 6,861,716 B1
(45) Date of Patent: Mar. 1, 2005

(54) LADDER-TYPE GATE STRUCTURE FOR FOUR-TERMINAL SOI SEMICONDUCTOR DEVICE

(75) Inventor: Paul A. Hyde, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,861

(22) Filed: Oct. 31, 2003

(51) Int. Cl.[7] .......................... H01L 29/76; H01L 29/94; H01L 31/062; H01L 31/113; H01L 31/119
(52) U.S. Cl. .................... 257/401; 257/353; 257/354
(58) Field of Search .................. 257/401, 353, 257/354, 204, 205, 206, 210

(56) References Cited

U.S. PATENT DOCUMENTS

| | | | |
|---|---|---|---|
| 4,983,535 A | | 1/1991 | Blanchard |
| 5,215,931 A | | 6/1993 | Houston |
| 5,293,058 A | * | 3/1994 | Tsividis ........................ 257/364 |
| 5,770,881 A | | 6/1998 | Pelella et al. |
| 5,894,150 A | * | 4/1999 | Hshieh ........................ 257/335 |
| 5,930,605 A | | 7/1999 | Mistry et al. |
| 6,215,138 B1 | * | 4/2001 | Takao ........................ 257/288 |
| 6,275,059 B1 | | 8/2001 | Sah et al. |
| 6,307,237 B1 | * | 10/2001 | Erstad ........................ 257/401 |
| 6,429,477 B1 | | 8/2002 | Mandelman et al. |
| 6,436,744 B1 | * | 8/2002 | Bryant et al. ........ 257/E29.275 |
| 6,580,137 B2 | * | 6/2003 | Parke ........................ 257/401 |
| 6,764,917 B1 | * | 7/2004 | Chan et al. ................. 438/406 |
| 2002/0053706 A1 | | 5/2002 | Jung et al. |
| 2002/0106844 A1 | | 8/2002 | Kotani |
| 2003/0064567 A1 | | 4/2003 | Chaudhry et al. |

* cited by examiner

*Primary Examiner*—John F. Niebling
*Assistant Examiner*—Walter L. Lindsay, Jr.
(74) *Attorney, Agent, or Firm*—Anthony J. Canale; Hoffman, Warnick & D'Alessandro LLC

(57) ABSTRACT

A ladder-type gate structure for a silicon-on-insulator (SOI) four-terminal semiconductor device is disclosed. The structure includes a gate having a first and second portion, a body region, which is under the first portion of the gate, a body contact, which is adjacent to the second portion of the gate, and a plurality of body contacts connecting the body region to the body contact through a drain region. The gate structure provides an independently controlled body region and includes a substantially uniform voltage across the body region in the SOI semiconductor device.

12 Claims, 2 Drawing Sheets

LADDER-TYPE GATE STRUCTURE FOR FOUR-TERMINAL SOI SEMICONDUCTOR DEVICE

BACKGROUND OF INVENTION

1. Technical Field

The invention relates generally to semiconductor devices and more specifically to a semiconductor gate structure for a silicon-on-insulator (SOI) semiconductor device.

2. Related Art

To form a four-terminal (source, drain, gate, body) semiconductor device in bulk technology, electrical connection is typically made via the substrate to the body region. The body bias is relatively fixed for all bias conditions. Comparatively, the body region of a conventional SOI semiconductor device is isolated from the substrate by the underlying insulator. Thus, conventional SOI semiconductor devices typically have three terminals (source, drain, gate) with the body region of the SOI semiconductor devices either being coupled to the source/drain terminals, coupled to the backgate of the body region, or not coupled at all (electrically floating). In the aforementioned cases, the body bias is generally not fixed for all bias conditions. That is, if the body region electrically floats, the body bias of the body region is normally dependent on the terminal biases. The coupling of the body region to any other region also results in a modified device behavior when compared to the expected behavior of a fixed body bias.

Contact to the body region of an SOI semiconductor device is needed to form a four-terminal SOI semiconductor device. Such four-terminal semiconductor devices provide a fixed body bias and are analogous to a bulk semiconductor device, except that bulk semiconductor devices generally have very low series resistance between the body contact and the actual body region of the device. In four-terminal SOI semiconductor devices heretofore known, control of the body region voltage is accomplished through either contacting the body region at the edge of the semiconductor device, or providing a semiconductor contact region at the surface of the semiconductor device that may be used to contact and control the voltage of the body region. One example of the latter case is an H-gate semiconductor device. Contacting the body region through a semiconductor device such as an H-gate semiconductor device provides accurate control voltage only at the points proximate the contact. The resistance to any point of the body region increases with distance away from the contact. Therefore, any current provided through the contact will cause a corresponding increase in series resistance across the body region at distances away from the contact. As a result, a single contact does not provide a low series resistance and consequently, does not provide a uniform voltage across the entire body region for either testing or operation of the four-terminal semiconductor device. Accordingly, a need has developed in the art for a structure and method that will provide a substantially uniform voltage across the body region in a four-terminal SOI semiconductor device.

SUMMARY OF INVENTION

The present invention provides a four-terminal SOI semiconductor device that includes a gate structure for providing a substantially uniform voltage across a body region through a plurality of paths to the body region in the SOI semiconductor device.

Generally, a first aspect of the present invention is directed to a semiconductor structure formed on an insulating layer, the structure comprising: a gate having a first portion and a second portion; a body region under the first portion of the gate; a body contact adjacent to the second portion of the gate; and a plurality of body paths connecting the body region to the body contact through a drain region.

In addition, a second aspect of the present invention provides a method comprising the steps of: forming a body region on an insulating layer; forming a gate having a first portion and a second portion, the first portion of the gate formed on top of the body region; forming a body contact adjacent to the second portion of the gate; and connecting the body region to the body contact through a plurality of body paths through a drain region.

The present invention also provides a four-terminal silicon-on-insulator semiconductor device comprising: an insulating layer; a gate over the insulating layer having a first portion and a second portion; a body region under the first portion of the gate; a body contact adjacent to the second portion of the gate; and a plurality of body paths connecting the body region to the body contact through a drain region.

The foregoing and other features of the invention will be apparent from the following more particular description of embodiments of the invention, as illustrated in the accompanying drawings.

BRIEF DESCRIPTION OF DRAWINGS

Embodiments of the present invention will hereinafter be described in conjunction with the appended drawings, where like designations denote like elements, and wherein.

DETAILED DESCRIPTION

Figure 1:
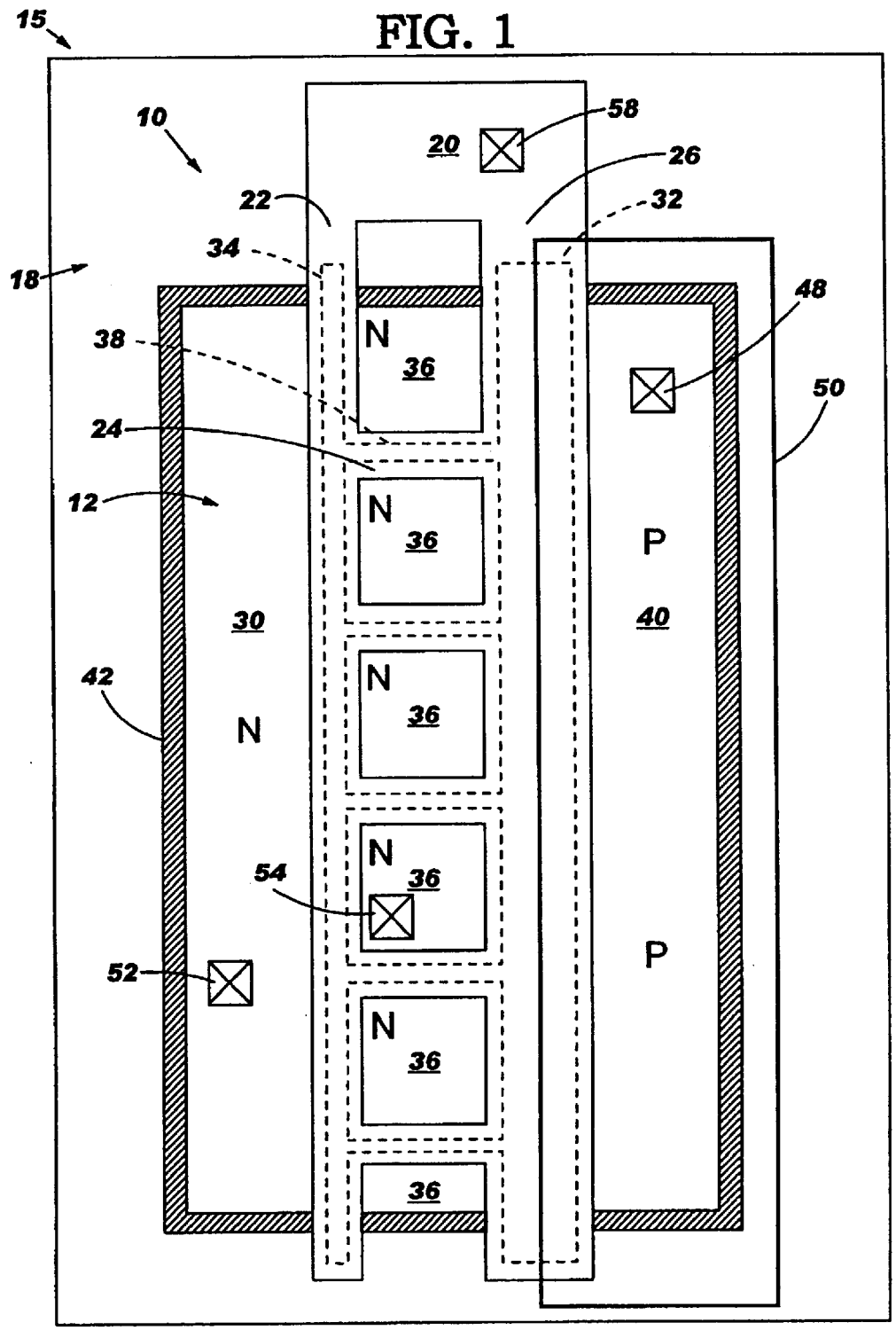
FIG. 1 is a plan view of a SOI semiconductor structure in accordance with a first embodiment of the present invention.

With reference to the accompanying drawings, FIG. 1 is a plan view of a semiconductor structure 10 for a four-terminal SOI semiconductor device 15 in accordance with a first embodiment of the invention. Semiconductor structure 10 includes a ladder-type gate structure 20 and an active region 12, which is formed on an insulating layer 18 and surrounded by an isolation region 42. Ladder-type gate structure 20 includes a first portion 22, a second portion 26, a plurality of body path portions 24 connecting first portion 22 to second portion 26, and gate contact 58. In this specific example, first portion 22 is parallel to second portion 26 with body path portions 24 being perpendicular to first portion 22 and second portion 26, but the invention is not limited to such. Body path portions 24 are formed through a drain region 36, and are formed as narrow as known gate designs allow.

A source region 30 is located in active region 12 between first portion 22 of ladder-type gate structure 20 and isolation region 42. Drain region 36 is located in active region 12 between first portion 22 and second portion 26. Source region 30 and drain region 36 have a first conductivity type (e.g., N). Source region 30 includes source contact 52 and drain region 36 includes drain contact 54. Source region 30 and drain region 36 may be formed within active region 12 by any method known to one of ordinary skill in the art, such as by known ion implantation methods.

A body region 34 under first portion 22 of ladder-type gate structure 20 may be contacted and independently controlled through a body contact 48. Body contact 48 is located in an implant region 40, which extends from and is adjacent to second portion 26 of ladder-type gate structure 20. Body contact 48 contacts body region 34 through a second portion body region 32 under second portion 26, and through a plurality of body paths 38 under body path portions 24. Implant region 40 may be defined by mask 50. Implant region 40, body region 34, body paths 38, and second portion body region 32 all are of a second conductivity type (e.g., P). Body paths 38 are coplanar with a top surface of body region 34 and connect body region 34 to second portion body region 32 through drain region 36. Body paths 38 are also coplanar with a top surface of second portion body region 32. Body contact 48, source contact 52, drain contact 54, and gate contact 58 form the four terminals for four-terminal SOI semiconductor device 15.

Although five body paths 38 are shown in this specific example, it is to be understood that the invention is not limited to such, and if desired, even a single body path may be used. The contact of body region 34 through body paths 38 allows for a reduced voltage across body region 34 as compared to known alternatives (e.g., the H-gate semiconductor device), since the average body resistance and diode current are reduced through body paths 38 and second portion body region 32 of the present invention. Furthermore, the contact of body region 34 through body paths 38 allows for a substantially uniform voltage across body region 34.

Ladder-type gate structure 20, body region 34, body paths 38 and second portion body region 32 may be formed through a conventional SOI process without the need for extra masks. That is, a thin gate oxide layer may be provided over active region 12, followed by a doped polysilicon gate layer. The doped polysilicon gate layer and the gate oxide layer are selectively etched to form ladder-type gate structure 20.

Although in this specific example, semiconductor structure 10 includes a silicon-on-insulator (SOI) npn transistor, with N-type source region 30 and drain region 36 and P-type body region 34, body paths 38, and second portion body region 32 under ladder-type gate structure 20, it is to be understood that a pnp transistor with corresponding regions and modifications to semiconductor structure 10 may also be used.

Figure 2:
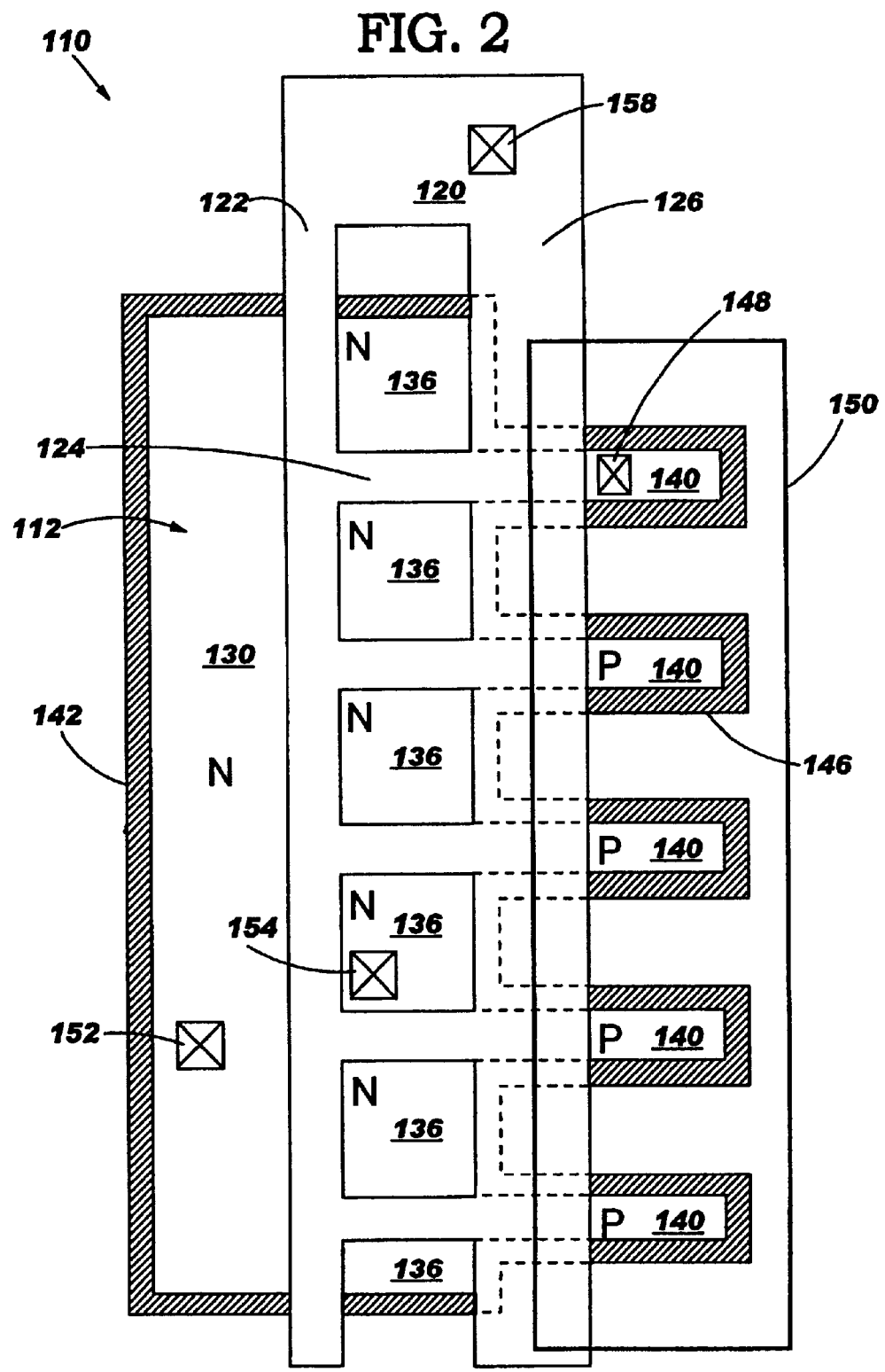
FIG. 2 is a plan view of a SOI semiconductor structure in accordance with a second embodiment of the present invention.

FIG. 2 is a plan view of a semiconductor structure 110 in accordance with a second embodiment of the invention. Semiconductor structure 110 is similar in structure to semiconductor structure 10 (FIG. 1) except for the formation of active region 112 and implant region 140.

Semiconductor structure 110 includes a ladder-type gate structure 120 and an active region 112, which is formed on an insulating layer similar to insulating layer 18 (FIG. 1) and surrounded by an isolation region 142. Ladder-type gate structure 120 includes a first portion 122, a second portion 126, a plurality of body path portions 124 connecting first portion 122 to second portion 126, and gate contact 158. As in the previous example, first portion 122 is parallel to second portion 126 with body path portions 124 being perpendicular to first portion 122 and second portion 126, but the invention is not limited to such. Body path portions 124 are formed through a drain region 136.

A source region 130 is located in active region 112 between first portion 122 of ladder-type gate structure 120 and isolation region 142. Drain region 136 is located in active region 112 between first portion 122 and second portion 126. Source region 130 and drain region 136 have a first conductivity type (e.g., N). Source region 130 includes source contact 152 and drain region 136 includes drain contact 154. Source region 130 and drain region 136 may be formed within active region 112 by any method known to one of ordinary skill in the art, such as by known ion implantation methods.

Implant region 140 extends from second portion 126 of ladder-type gate structure 120 and may be defined by mask 150. Active region 112 under ladder-type gate structure 120 and implant region 140 are of a second conductivity type. Implant region 140 includes body contact 148. Body contact 148, source contact 152, drain contact 154, and gate contact 158 form the four terminals for semiconductor structure 110.

In this embodiment, active region 112 is notched in implant region 140, with notches 146 extending as far under or past second portion 126 of ladder-type gate structure 120 as possible without interfering with the electrical contact to drain region 136. As compared to active region 12 (FIG. 1), the decrease of active region 112 under second portion 126 of ladder-type gate structure 120 reduces the gate leakage with a very small increase in the body resistance. Although five notches 146 are shown for this specific example, it is to be understood that the invention is not limited to such.

As in FIG. 1, ladder-type gate structure 120 of FIG. 2 may be formed through a conventional SOI process without the need for extra masks.

Although in this specific example, semiconductor structure 110 includes a silicon-on-insulator (SOI) npn transistor, with N-type source region 130 and drain region 136 and P-type active region 112 under ladder-type gate structure 120, it is to be understood that a pnp transistor with corresponding regions and modifications to semiconductor structure 110 may also be used.

The present invention thus provides a four-terminal SOI semiconductor device that includes a gate structure providing a plurality of paths to a body region in the SOI semiconductor device, which allows for a substantially uniform voltage across the body region. Although SOI technology is specifically discussed in reference to the present invention, it is to be understood that technology similar to SOI, such as the silicon-on-sapphire (SOS) technology, may also be used.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed:

1. A semiconductor structure formed on an insulating layer, the structure comprising:
   a gate having a first portion and a second portion;
   a body region under the first portion of the gate;
   a body contact adjacent to the second portion of the gate; and
   a plurality of body paths connecting the body region to the body contact through a drain region.

2. The structure of claim 1, wherein the body paths are coplanar with a top surface of the body region.

3. The structure of claim 1, wherein the first portion is substantially parallel with the second portion.

4. The structure of claim 1, further comprising:
   a second portion body region under the second portion of the gate; and an implant region including the body contact, the implant region connected to the second portion body region, wherein the body contact contacts the body region through the implant region, the second portion body region and the body paths.

5. The structure of claim 1, further comprising:

a plurality of body path portions over the body paths, wherein the plurality of body path portions connect the first portion of the gate to the second portion of the gate.

6. The structure of claim 4, wherein the implant region includes at least one notched area extending under the second portion of the gate.

7. A four-terminal silicon-on-insulator semiconductor device comprising:

an insulating layer;

a gate over the insulating layer having a first portion and a second portion;

a body region under the first portion of the gate;

a body contact adjacent to the second portion of the gate; and a plurality of body paths connecting the body region to the body contact through a drain region.

8. The device of claim 7, further comprising:

a second portion body region under the second portion of the gate; and an implant region including the body contact, the implant region connected to the second portion body region, wherein the body contact contacts the body region through the implant region, the second portion body region and the body paths.

9. The device of claim 8, wherein the implant region includes at least one notched area extending under the second portion of the gate.

10. The device of claim 7, further comprising:

a plurality of body path portions over the body paths, wherein the plurality of body path portions connect the first portion of the gate to the second portion of the gate.

11. The device of claim 7, wherein the body paths are coplanar with a top surface of the body region.

12. The device of claim 7, wherein the first portion is substantially parallel with the second portion.

* * * * *